(12) United States Patent
Tang et al.

(10) Patent No.: US 8,508,203 B2
(45) Date of Patent: Aug. 13, 2013

(54) CONTROL CIRCUIT OF SWITCHING REGULATOR AND CONTROL METHOD THEREOF AND TRANSISTOR DEVICE THEREFOR

(75) Inventors: Chien Fu Tang, Hsinchu (TW); Isaac Y. Chen, Zhubei (TW); Pei-kai Tseng, Zhubei (TW)

(73) Assignee: Richtek Technology Corporation, Chupei, Hsin-Chu (TW)

( * ) Notice: Subject to any disclaimer, the term of this patent is extended or adjusted under 35 U.S.C. 154(b) by 318 days.

(21) Appl. No.: 12/927,280

(22) Filed: Nov. 10, 2010

(65) Prior Publication Data

US 2011/0298436 A1 Dec. 8, 2011

(30) Foreign Application Priority Data

Jun. 7, 2010 (TW) .................................. 99118402 A

(51) Int. Cl.
*H02M 3/156* (2006.01)

(52) U.S. Cl.
USPC .............................. 323/282; 323/223; 323/224

(58) Field of Classification Search
USPC .................. 323/223, 224, 225, 282, 284, 283
See application file for complete search history.

(56) References Cited

U.S. PATENT DOCUMENTS

| | | | |
|---|---|---|---|
| 5,446,300 A | 8/1995 | Amato et al. | |
| 7,151,681 B2* | 12/2006 | Yang et al. | 363/21.13 |
| 7,482,795 B2* | 1/2009 | Parto et al. | 323/284 |
| 7,598,715 B1* | 10/2009 | Hariman et al. | 323/271 |
| 8,111,051 B2* | 2/2012 | Sakai et al. | 323/224 |
| 2005/0007082 A1* | 1/2005 | Bretz et al. | 323/274 |
| 2009/0009148 A1* | 1/2009 | Philbrick | 323/282 |
| 2010/0033237 A1* | 2/2010 | Liang et al. | 327/543 |
| 2010/0327836 A1* | 12/2010 | Li et al. | 323/283 |

* cited by examiner

*Primary Examiner* — Adolf Berhane
*Assistant Examiner* — Gustavo Rosario Benitez
(74) *Attorney, Agent, or Firm* — Tung & Associates

(57) ABSTRACT

The present invention discloses a control circuit of a switching regulator wherein a confirmation signal is generated to confirm that an upper gate switch has been turned off, to avoid shoot-through. The confirmation signal is generated by obtaining an upper gate sampling signal from a transistor in a level shift circuit which receives a resetting signal for turning off the upper gate switch.

13 Claims, 7 Drawing Sheets

CONTROL CIRCUIT OF SWITCHING REGULATOR AND CONTROL METHOD THEREOF AND TRANSISTOR DEVICE THEREFOR

BACKGROUND OF THE INVENTION

1. Field of Invention

The present invention relates to a control circuit of a switching regulator wherein a confirmation signal related to an upper gate switch is generated to confirm that the upper gate switch has been turned off, to safely operate a lower gate switch, and to avoid shoot-through. The present invention also relates to a control method for controlling a switching regulator, and a transistor device for use in a control circuit of a switching regulator.

2. Description of Related Art

FIG. 1 shows a schematic diagram of a conventional switching regulator control circuit, wherein an upper gate switch UG and a lower gate switch LG of the switching regulator are driven by an upper gate driver circuit 13 and a lower gate driver circuit 14, as shown in the figure. The upper gate driver circuit 13 includes a latch circuit 131 and a driver circuit 132, and the lower gate driver circuit 14 includes a latch circuit 141 and a driver circuit 142. The upper gate driver circuit 13 is controlled by a level shift circuit 12, and the lower gate driver circuit 14 is controlled by a control logic circuit 11. When an input voltage Vin is a relatively high voltage, for example 400 volts, the level shift circuit 12 is required for providing a correct operating voltage to the upper gate driver circuit 13 in order to properly drive the upper gate switch UG. Because the input voltage Vin is high, a high voltage shielding device such as a lateral diffused metal-oxide-semiconductor (LDMOS) device must be used as the first transistor Q1 and the second transistor Q2 in the level shift circuit 12. The transistors Q1 and Q2 occupy a relatively large area of the whole circuit. One example of this kind of switching regulator is disclosed in U.S. Pat. No. 5,446,300.

The circuit shown in FIG. 1 has a risk of shoot-through. The so-called shoot-through means that the upper gate switch UG and the lower gate switch LG are both ON at the same time, causing the input voltage Vin to short to ground. The reason why shoot-through happens is thus. When the control logic circuit 11 generates a control signal (i.e., the resetting signal RESET) to turn OFF the upper gate switch UG, due to operation delay of the level shift circuit 12 and the upper gate driver circuit 13, the actual timing when the upper gate switch UG is turned OFF is later than the level switching timing of the resetting signal RESET. Therefore, if the control logic circuit 11 turns ON the lower gate switch LG at the same time as it outputs the resetting signal RESET, shoot-through will occur. In this regard, the aforementioned U.S. Pat. No. 5,446,300 does not mention any mechanism to protect the circuit from shoot-through. Presently, one typical solution is to delay a fixed dead time after the control logic circuit 11 outputs the resetting signal RESET, for example, to turn ON the lower gate switch LG after 500~1000 nanoseconds (ns) from when the control logic circuit 11 outputs the resetting signal RESET, to prevent from shoot-through. This open loop solution is not satisfactory because the dead time is set manually and usually not optimized. If the dead time is set too long, the efficiency is not optimized; if the dead time is set too short, the risk of shoot-through remains.

In view of the above drawbacks, the present invention provides a switching regulator driver circuit which samples a signal related to the upper gate switch UG to confirm that the upper gate switch UG is OFF, so that the lower gate switch LG can be turned ON safely. Thus, in avoiding shoot-through, the circuit operates with optimized efficiency, and the device or circuit area is not significantly increased as compared to the prior art. The present invention also provides a control method of the switching regulator and a transistor device for use in a control circuit of a switching regulator.

SUMMARY OF THE INVENTION

The first objective of the present invention is to provide a control circuit of a switching regulator.

The second objective of the present invention is to provide a control method of a switching regulator.

The third objective of the present invention is to provide a transistor device for use in a control circuit of a switching regulator.

To achieve the objectives mentioned above, from one perspective, the present invention provides a control circuit of a switching regulator, the switching regulator having an upper gate switch and a lower gate switch for converting an input voltage to an output voltage, the control circuit comprising: a control logic circuit, for receiving a pulse width modulation (PWM) signal and a confirmation signal, and generating a setting signal, a resetting signal, and a lower gate control signal; a level shift circuit, coupled to the control logic circuit, for converting the setting signal and the resetting signal to upper gate operation signals with predetermined levels; an upper gate driver circuit, coupled to the level shift circuit, for driving the upper gate switch according to the upper gate operation signals; a sampling and detecting circuit, for obtaining a first upper gate sampling signal according to the resetting signal, and generating the confirmation signal according to the first upper gate sampling signal, the confirmation signal being inputted to the control logic circuit; and a lower gate driver circuit, coupled to the control logic circuit, for driving a lower gate switch according to the lower gate control signal, wherein the lower gate switch is turned on by the lower gate control signal only after the confirmation signal confirms that the upper gate switch has been turned off.

In one embodiment of the control circuit, the level shift circuit includes a first transistor and a second transistor which are controlled by the setting signal and the resetting signal respectively, and the upper gate driver circuit is coupled between a boot voltage and a node between the upper gate switch and the lower gate switch, and wherein the first upper gate sampling signal is obtained from a current inflow end of the first transistor, a current inflow end of the second transistor, the boot voltage, or a voltage at the node.

In the aforementioned control circuit, the sampling and detecting circuit preferably includes: a sampling transistor which has: a current inflow end, from where the first upper gate sampling signal is obtained; a current outflow end; and a control end, controlled by the resetting signal; an extractor device, coupled to the current outflow end, for extracting a second upper gate sampling signal from the current outflow end; and a detector device, coupled to the extractor device, for receiving the second upper gate sampling signal and generating the confirmation signal according to the second upper gate sampling signal.

In one embodiment, the sampling transistor and the second transistor share one common current inflow end and one common control end, but their current outflow ends are isolated from each other.

In one embodiment, the sampling transistor is a laterally diffused metal oxide semiconductor (LDMOS) device, a junction field effect transistor (JFET), or a bipolar junction transistor (BJT).

In one embodiment, the detector device includes: a delay circuit including a resistor and a capacitor electrically connected with each other, the delay circuit receiving the second upper gate sampling signal and generating a delay signal; and a comparator, comparing the second upper gate sampling signal and the delay signal to generate the confirmation signal. The detector device further includes a bias circuit coupled between the delay circuit and the comparator.

From another perspective, the present invention provides a control method for controlling a switching regulator, the switching regulator having an upper gate switch and a lower gate switch for converting an input voltage to an output voltage, the control method comprising: receiving a PWM signal and a confirmation signal, and generating a setting signal, a resetting signal, and a lower gate driver circuit; converting the setting signal and the resetting signal to upper gate operation signals with predetermined levels, wherein the upper gate operation signals operate between a boot voltage and a voltage at a node between the upper gate switch and the lower gate switch; generating an upper gate driving signal according to the upper gate operation signals to control the upper gate switch; obtaining a first upper gate sampling signal from the resetting signal, and generating a confirmation signal according to the first upper gate sampling signal, wherein the confirmation signal is for confirming that the upper gate switch has been turned off; generating a lower gate control signal according to the confirmation signal; and generating a lower gate driving signal according to the lower gate control signal to control the lower gate switch.

In the aforementioned control method, the first upper gate sampling signal may be obtained from one of the upper gate operation signals, the boot voltage, or the voltage at the node between the upper gate switch and the lower gate switch.

From another perspective, the present invention provides a transistor device for use in a control circuit of a switching regulator, the transistor device comprising: a current inflow end located at an interior area of the transistor device; a control end located outside the current inflow end; and a first and a second current outflow ends located outside the control end, the first and the second current outflow ends being isolated from each other, wherein the area of the first current outflow end is smaller than the area of the second current outflow end such that the current inflow end, the control end, and the first current outflow end form a sampling transistor.

The objectives, technical details, features, and effects of the present invention will be better understood with regard to the detailed description of the embodiments below.

DESCRIPTION OF THE PREFERRED EMBODIMENTS

The drawings as referred to throughout the description of the present invention are for illustration only, but not drawn according to actual scale.

The present invention confirms that the upper gate switch is OFF by sampling a signal related to the upper gate switch, and generate a confirmation signal accordingly. In this way, the present invention avoids shoot-through, the device or the circuit area is not significantly increased as compared to the prior art.

Figure 1:
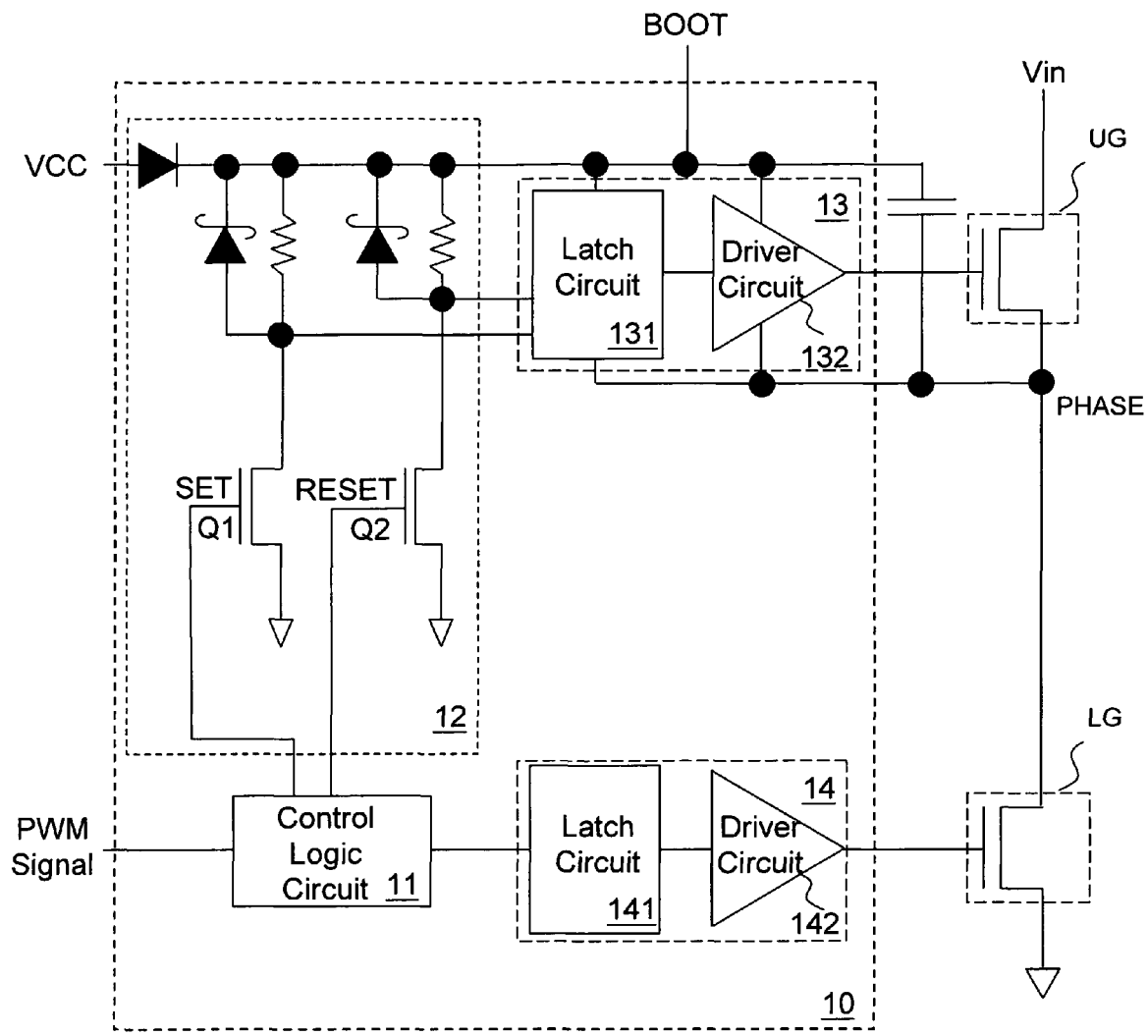
FIG. 1 shows a schematic diagram of a conventional switching regulator control circuit.
Figure 2:
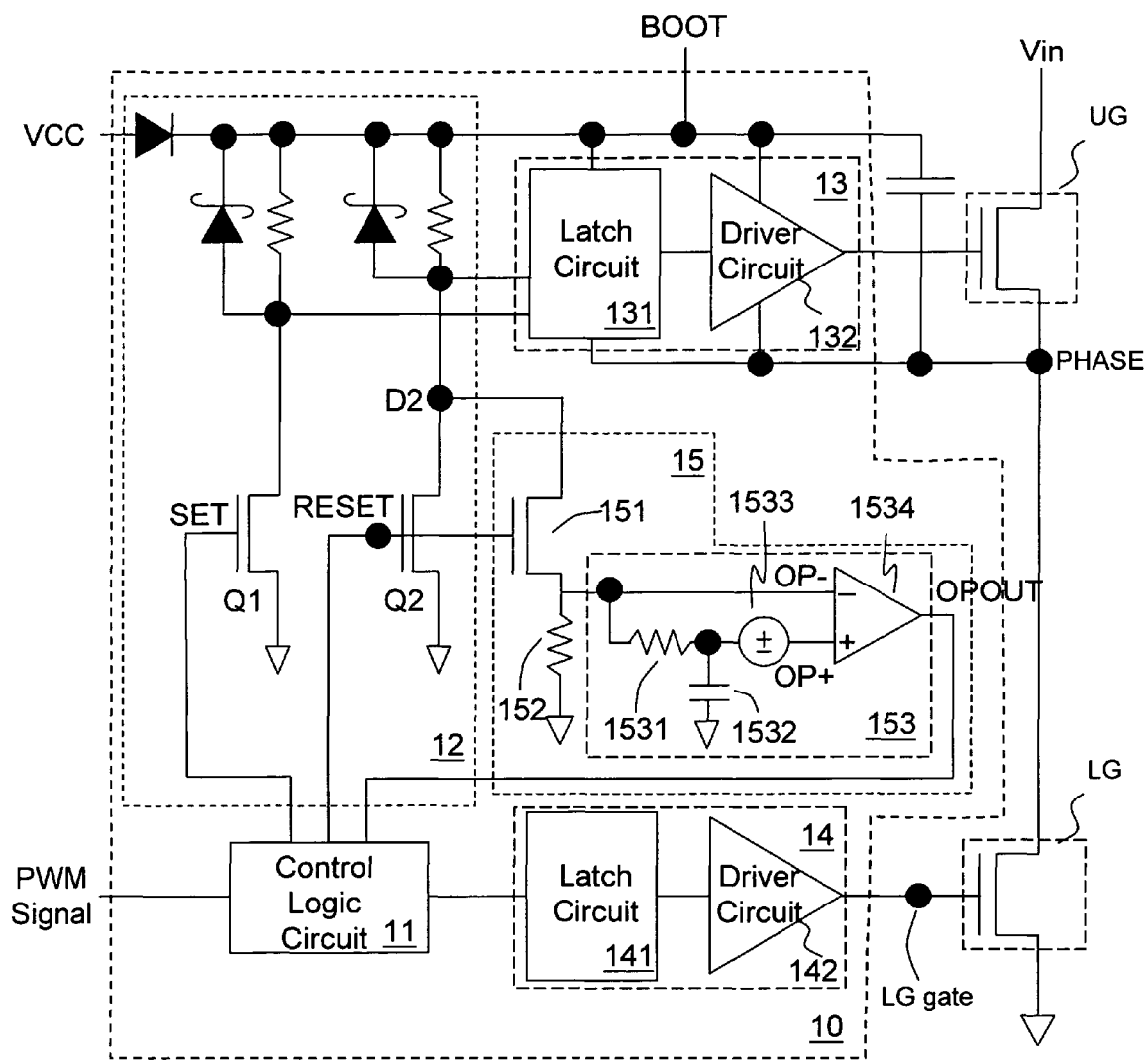
FIG. 2 shows an embodiment of the present invention, which confirms that the upper gate switch UG is OFF by sampling the drain signal D2 of the second transistor Q2.

FIG. 2 shows an embodiment of the present invention. This embodiment samples the drain voltage signal of the second transistor Q2, which is one example of the "signal related to the upper gate switch", to determine whether the upper gate switch UG is OFF. As shown in FIG. 2, a control logic circuit 11 receives a pulse width modulation (PWM) signal, and outputs a setting signal SET and a resetting signal RESET to a level shift circuit 12 which converts the setting signal SET and the resetting signal RESET to ON and OFF operation signals of the upper gate switch UG, respectively. This embodiment is different from the prior art of FIG. 1 in that, this embodiment includes a sampling and detecting circuit 15, and the sampling and detecting circuit 15 generates a confirmation signal OPOUT after confirming that the upper gate switch UG is OFF. According to the confirmation signal OPOUT and the PWM signal, the control logic circuit 11 generates a lower gate control signal and sends it to a lower gate driver circuit 14. The lower gate driver circuit 14 generates a lower gate driving signal which drives the lower gate switch UG according to the lower gate control signal. Thus, the circuit turns ON the lower gate switch LG only after it confirms that the upper gate switch UG is OFF, to avoid shoot-through.

In this embodiment, the sampling and detecting circuit 15 generates a confirmation signal as below. The sampling and detecting circuit 15 includes a sampling transistor 151, a resistor 152, and a detector device 153. The current inflow end of the sampling transistor 151 is coupled to the current inflow end D2 of the second transistor Q2; the control end of the sampling transistor 151 is coupled to the control end of the second transistor Q2, for receiving the resetting signal RESET; and the current outflow end of the sampling transistor 151 is coupled to one end of the resistor 152, while the other end of the resistor 152 is coupled to ground (in an NMOS, the current inflow end, the control end, and the current outflow end are the drain, the gate, and the source respectively; in a PMOS or a BJT, the current inflow end, the control end, and the current outflow end are the corresponding terminals of such devices as well known in this field). The voltage of the drain D2 of the second transistor Q2 may be taken as the first upper gate sampling signal. The change of this signal indicates the status of the upper gate switch, and this will be described in details later referring to FIG. 3. The resistor 152 functions as an extractor device for extracting the source voltage signal of the transistor 151 and inputting it to the detector device 153. The source voltage signal of the transistor 151 is the second upper gate sampling signal. And the detector device 153 generates the confirmation signal OPOUT according to the second upper gate sampling signal.

The detector device 153 is coupled to one end of the resistor 152 to detect the voltage across the resistor 152. By detecting the level switching point of the voltage across the resistor 152, when the upper gate switch UG is OFF can be confirmed. The detection of the level switching point for example may be as below: generating a delayed signal according to the voltage across the resistor 152; comparing the delayed signal with the voltage across the resistor 152 (non-delayed signal); and determining the level switching point according to the cross point of the two signals. In this embodiment, the detector 153 includes: a delay circuit including a resistor 1531 and a capacitor 1532; a bias circuit 1533 coupled to the delay circuit, for providing a bias to the output of the delay circuit; and a comparator 1534, comparing a non-delayed second upper gate sampling signal received by its positive input terminal OP+ with a delayed second upper gate sampling signal received by its negative input terminal OP− to generate the confirmation signal OPOUT. The confirmation signal OPOUT is then outputted to the control logic circuit 11. The resistance of the resistor 1531, the capacitance of the capacitor 1532, and the bias voltage of the bias circuit 1533 can be adjusted to determine the delay time from when the upper gate switch UG is confirmed OFF to the generation of the confirmation signal OPOUT. In other words, by adjusting the resistance of the resistor 1531, the capacitance of the capacitor 1532, and the bias voltage of the bias circuit 1533, the dead time between when the upper gate switch is OFF and when the lower gate switch is ON can be set. Note that, different from the prior art, the setting of the dead time in the present invention is not for the purpose to ensure that the upper gate switch is OFF, because it has been confirmed. The dead time can be used for other purposes.

Figure 3:
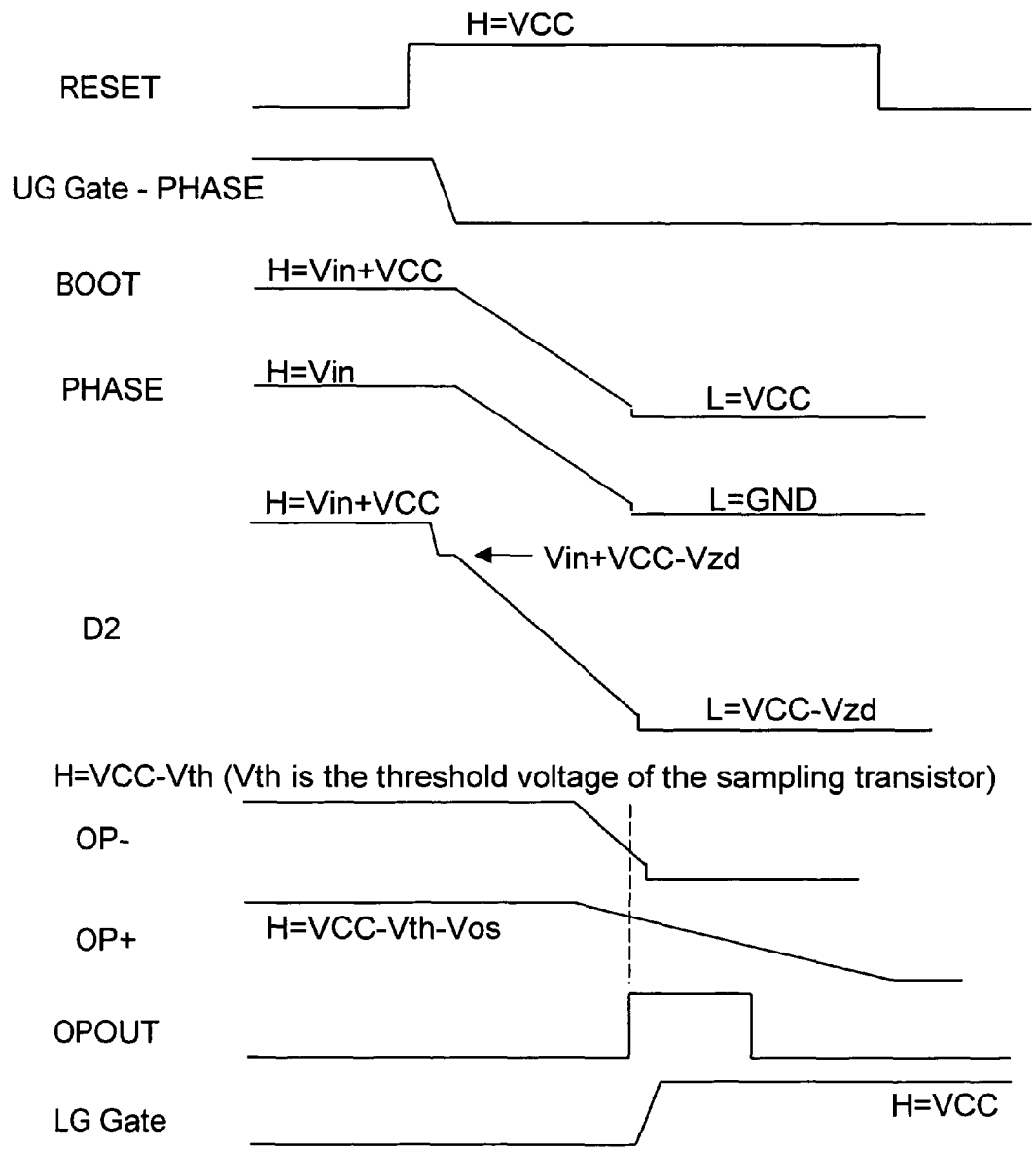
FIG. 3 shows signal waveforms of several critical nodes in the embodiment of FIG. 2.

FIG. 3 shows signal waveforms of several critical nodes in the embodiment of FIG. 2. When the resetting signal RESET switches from low level to high level (which is the circuit supply voltage VCC), the second transistor Q2 turns ON, and the level shift circuit 12 converts the resetting signal RESET to an upper gate operation signal with a predetermined level; the upper driver circuit 13 turns OFF the upper gate switch UG according to the upper gate operation signal, as shown by the waveform of the voltage difference (UG Gate—PHASE) between the upper gate switch UG and the phase node PHASE. Because the upper gate switch UG is OFF, the voltage of the phase node PHASE gradually decreases from the input voltage Vin. Because the boot voltage BOOT is the voltage of the phase node PHASE plus the boot strap voltage, the boot voltage BOOT also gradually decreases from the voltage Vin+VCC.

Still referring to FIG. 3, after the second transistor Q2 turns ON, due to the clamping effect of the Zener diode, the voltage difference between the drain signal D2 of the second transistor Q2 (i.e. the first upper gate sampling signal) and the boot voltage (BOOT) will be maintained at the Zener voltage Vzd, that is, the drain signal D2 will first drop from Vin+VCC by a Zener voltage Vzd, i.e. Vin+VCC−Vzd, and then gradually decrease following the decrease of the boot voltage BOOT. As the drain signal D2 decreases, the operation of the sampling transistor 151 moves from the saturation region to the linear region, and the source voltage signal of the sampling transistor 151 (i.e., the voltage across the resistor 152, the second upper gate sampling signal) begins decreasing as shown by the signal OP− (negative input terminal of comparator 1534) in this figure. On the other hand, the second upper gate sampling signal is delayed to generate the signal OP+ (positive input terminal of comparator 1534) as shown in this figure.

Vos is the bias voltage of the bias circuit 1533. The comparator 1534 compares the signal OP− and the signal OP+, and generates the confirmation signal OPOUT according to the cross point of the two signals, as shown by the waveform of the signal OPOUT in this figure. The lower gate switch LG turns ON according to the confirmation signal OPOUT, as shown by the waveform of the LG Gate signal in the bottom of this figure.

Figure 4A:
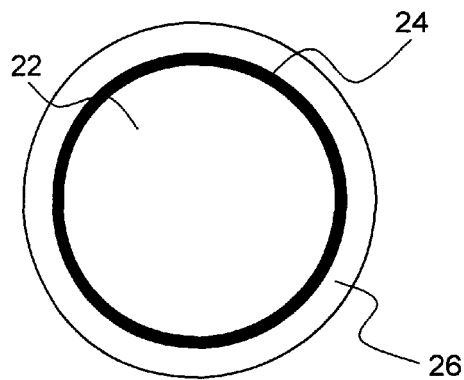
FIGS. 4A and 5A are top views showing prior art high voltage transistor devices.
Figure 5A:
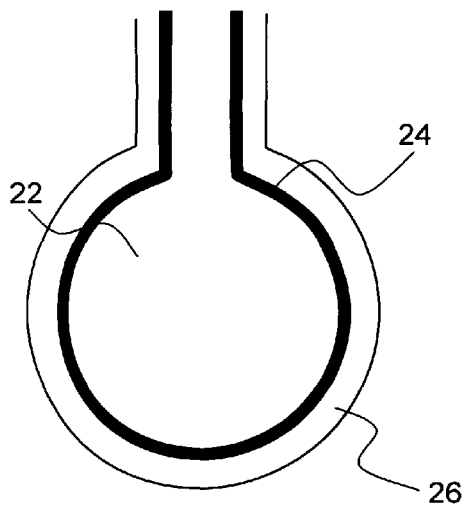

According to the present invention, the sampling transistor 151 and the second transistor Q2 may be two independent transistors, or, in a preferred embodiment, the sampling transistor 151 and the second transistor Q2 may be integrated as one single transistor device but with separate current outflow ends. FIGS. 4A and 5A show a prior art high voltage transistor device. This transistor device is typically used as the first transistor Q1 and the second transistor Q2 in the level shift circuit 12. As shown from the top view, the transistor device has a substantially circular body. The transistor device may be an NMOS or a PMOS. Taking an NMOS for example, the transistor device includes: a drain 22, a gate 24, and a source 26. The high voltage transistor device occupies a large area as it is required for high voltage operation.

Figure 4B:
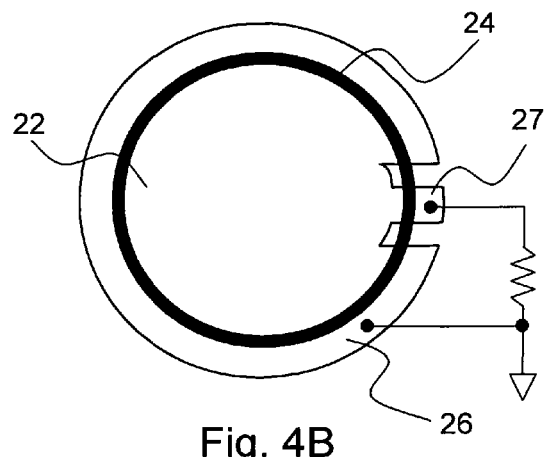
FIGS. 4B and 5B are top views showing transistor devices according to the present invention, for use in a control circuit of a switching regulator.
Figure 5B:
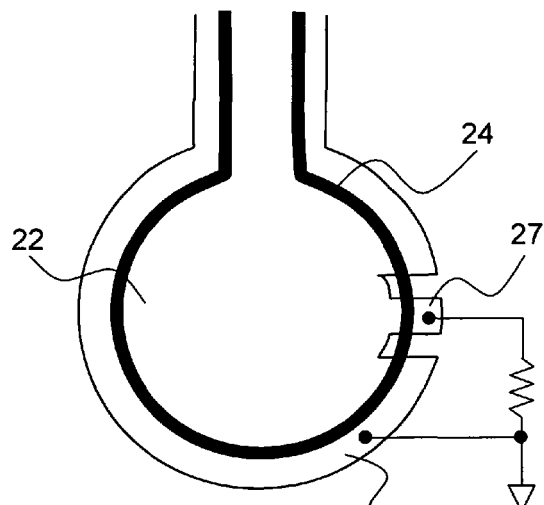

FIGS. 4B and 5B show a transistor device according to the present invention. The transistor device integrates the sampling transistor 151 and the second transistor Q2 to become one single device for use in the switching regulator control circuit. Compared to FIGS. 4A and 5A, in the present invention, the source 26 in the prior art is separated to a major part which is the source 26 of the high voltage device (the second transistor Q2), and a smaller part which is the source 27 of the sampling transistor 151; the gate 24 and the drain 22 are shared by the sampling transistor 151 and the second transistor Q2. As such, the function of the sampling transistor 151 in FIG. 2 can be achieved without significantly increasing the circuit area; it is not required to add to the circuit an additional device which has about the same size as the second transistor Q2 and occupies a relatively large area.

The integrated transistor device of the sampling transistor 151 and the second transistor Q2 may be, but is not limited to, a LDMOS. It also can be a junction field effect transistor (JFET), or a bipolar junction transistor (BJT).

Figure 6:
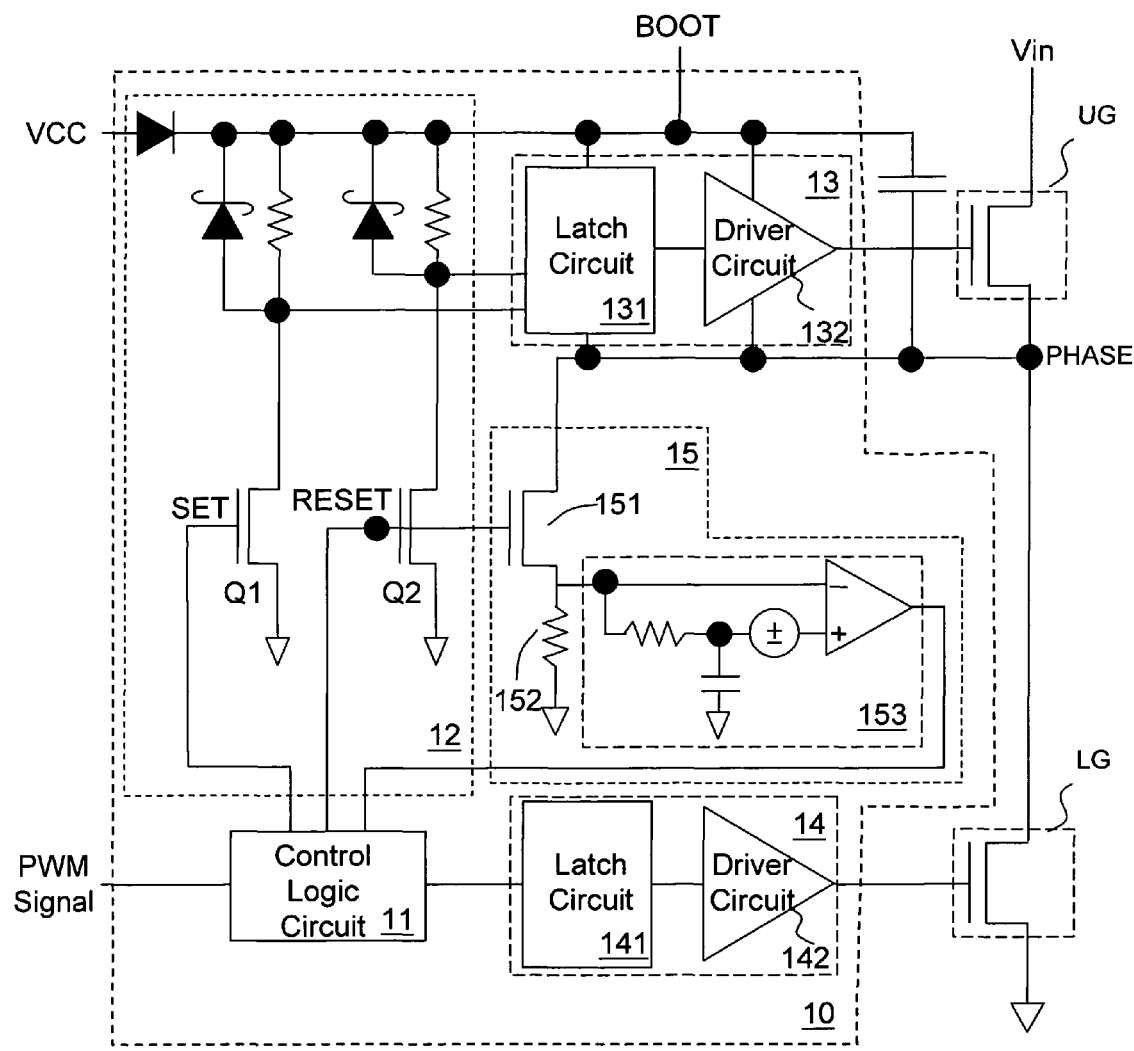
FIG. 6 shows another embodiment of the present invention, which confirms that the upper gate switch UG is OFF by sampling the phase node signal PHASE.
Figure 7:
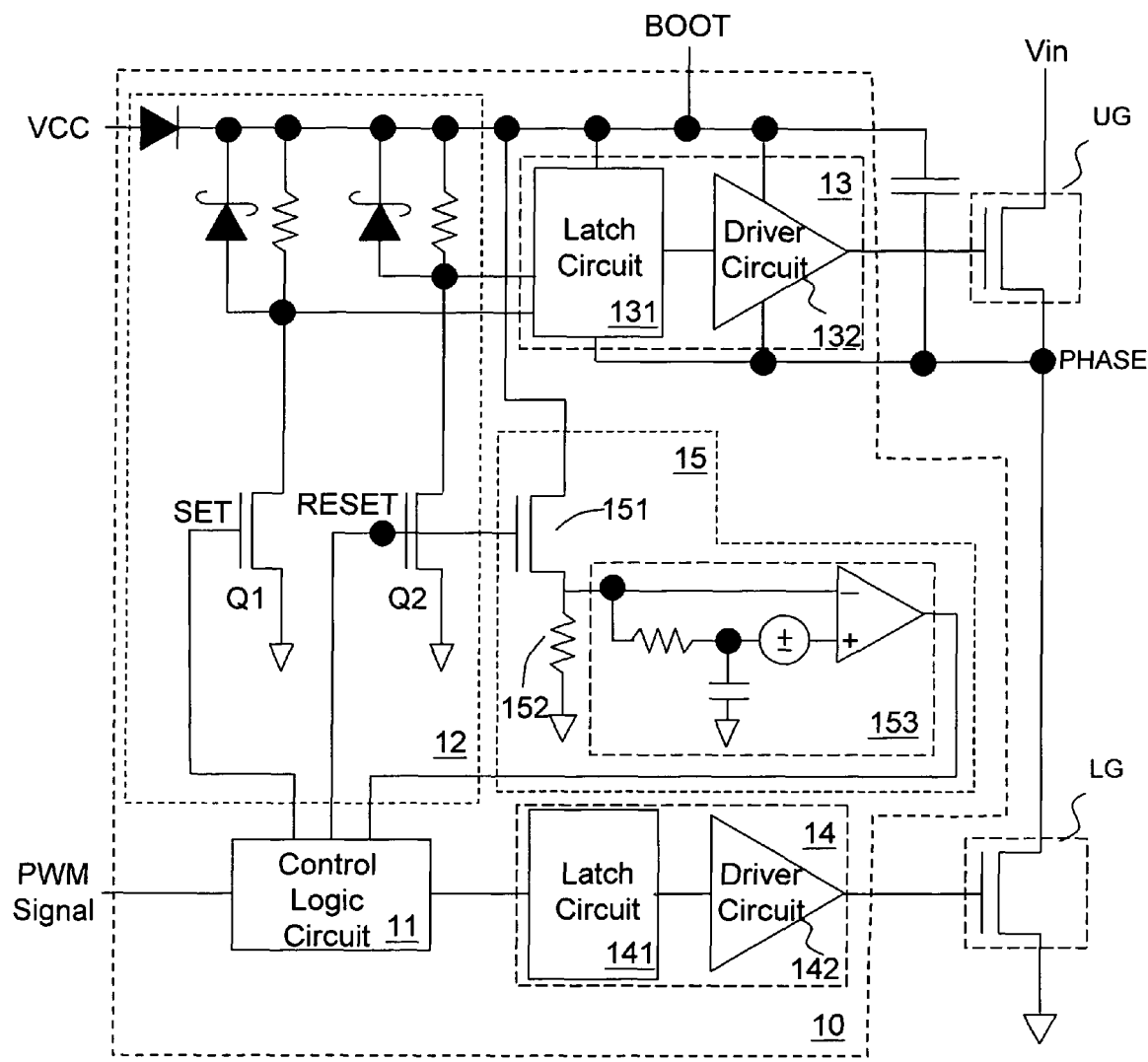
FIG. 7 shows another embodiment of the present invention, which confirms that the upper gate switch UG is OFF by sampling the boot voltage signal BOOT.
Figure 8:
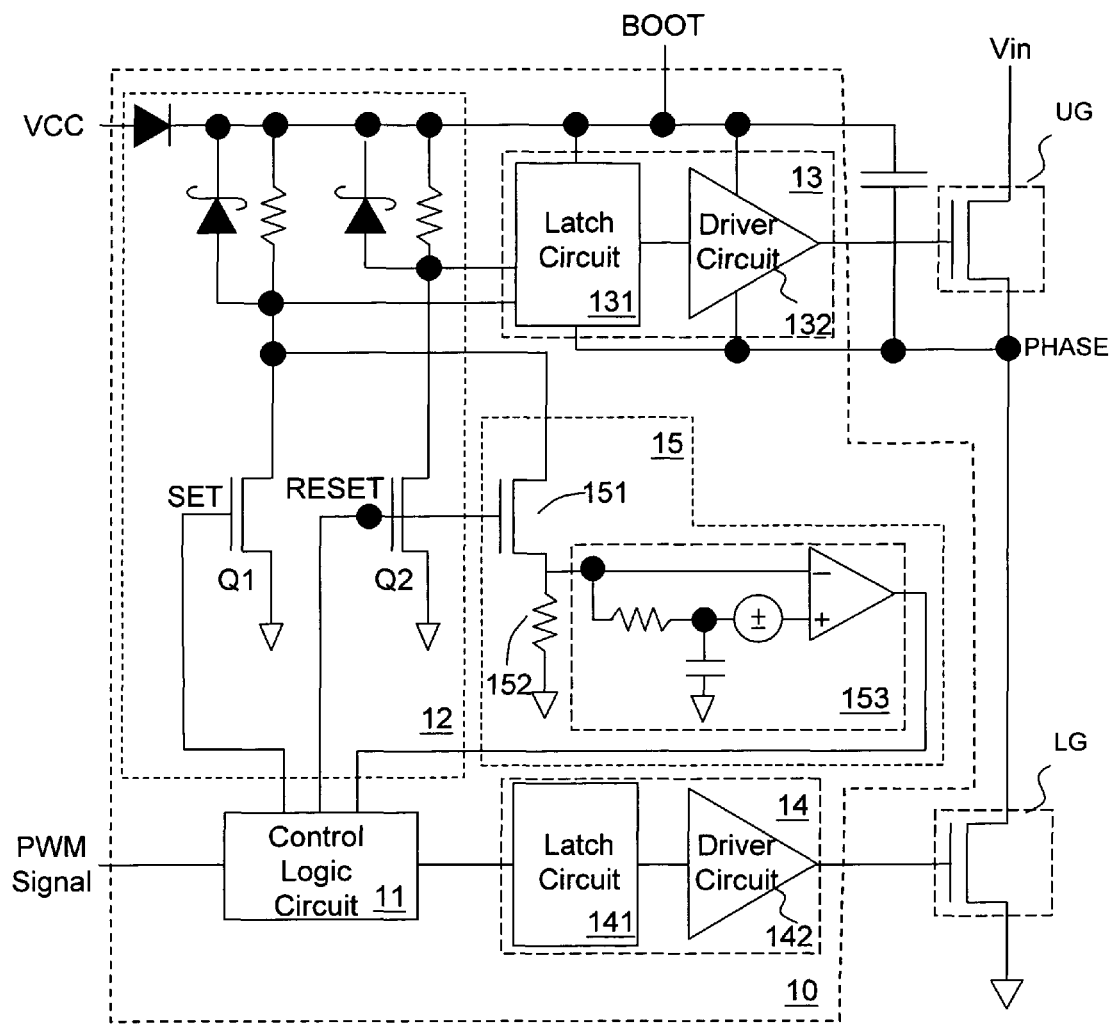
FIG. 8 shows yet another embodiment of the present invention, which confirms that the upper gate switch UG is OFF by sampling the drain signal of the first transistor Q1.

Referring back to FIG. 3, in particular to the signal waveforms of the boot voltage BOOT, the PHASE node voltage, and the D2 node voltage, it can be found that these signals are strongly correlated. Thus, the first upper gate sampling signal does not have to be obtained from the drain of the second transistor Q2. As shown in FIGS. 6 and 7, the first upper gate sampling signal also can be obtained from the PHASE node or the boot voltage BOOT. And because the drain voltage signal of the first transistor Q1 is also strongly correlated to the boot voltage BOOT, the first upper gate sampling signal also can be obtained from the drain of the first transistor Q1.

The present invention has been described in considerable detail with reference to certain preferred embodiments thereof. It should be understood that the description is for illustrative purpose, not for limiting the scope of the present invention. Those skilled in this art can readily conceive variations and modifications within the spirit of the present invention. For example, the sampling transistor of the present invention is not limited to one that shares certain parts of a transistor device with another transistor; it can also be a complete transistor device by itself. For another example, a circuit or device which does not substantially influence the primary function can be inserted between any two circuits or two devices shown to be connected directly in the embodiments. For another example, the area ratio of the sampling transistor 151 to the second transistor Q2 and the shape of the boundary therebetween are not limited to those as shown in FIGS. 4B and 5B, but they may be any other ratio or form. For another example, the positive and negative input terminals OP+ and OP− of the comparator 1534 are interchangeable, with corresponding amendment of the circuit in processing these signals. For another example, the extractor device is not limited to be a resistor, and it may be any other device as long as it can obtain the second upper gate sampling signal. For another example, the delay circuit is not limited to a circuit formed by the resistor and the capacitor, and it may be any other circuit which can delay a signal. For yet another example, it provides an equivalent effect if the bias circuit 1533 (with bias voltage of a different sign) is coupled to the negative input terminal OP− of the comparator. In view of the foregoing, the spirit of the present invention should cover all such and other modifications and variations, which should be interpreted to fall within the scope of the following claims and their equivalents.

What is claimed is:

1. A control circuit of a switching regulator, the switching regulator having an upper gate switch and a lower gate switch for converting an input voltage to an output voltage, the control circuit comprising:
   a control logic circuit, for receiving a pulse width modulation (PWM) signal and a confirmation signal, and generating a setting signal, a resetting signal, and a lower gate control signal;
   a level shift circuit, coupled to the control logic circuit, for converting the setting signal and the resetting signal to upper gate operation signals with predetermined levels;
   an upper gate driver circuit, coupled to the level shift circuit, for driving the upper gate switch according to the upper gate operation signals;
   a sampling and detecting circuit, for obtaining a first upper gate sampling signal according to the resetting signal, and generating the confirmation signal according to the first upper gate sampling signal, the confirmation signal being inputted to the control logic circuit; and
   a lower gate driver circuit, coupled to the control logic circuit, for driving a lower gate switch according to the lower gate control signal,
   wherein the lower gate switch is turned on by the lower gate control signal only after the confirmation signal confirms that the upper gate switch has been turned off, wherein the sampling and detecting circuit includes:
   a sampling transistor which has:
      a current inflow end, from where the first upper gate sampling signal is obtained, wherein the sampling transistor and the second transistor share one common current inflow end and one common control end;
      a current outflow end; and
      a control end, controlled by the resetting signal;
   an extractor device, coupled to the current outflow end, for extracting a second upper gate sampling signal from the current outflow end; and
   a detector device, coupled to the extractor device, for receiving the second upper gate sampling signal and generating the confirmation signal according to the second upper gate sampling signal.

2. The control circuit of claim 1, wherein the level shift circuit includes a first transistor and a second transistor which are controlled by the setting signal and the resetting signal respectively, and wherein the upper gate driver circuit is coupled between a boot voltage and a node between the upper gate switch and the lower gate switch, and wherein the first upper gate sampling signal is obtained from a current inflow end of the first transistor, a current inflow end of the second transistor, the boot voltage, or a voltage at the node.

3. The control circuit of claim 1, wherein the level shift circuit includes a first transistor and a second transistor which are controlled by the setting signal and the resetting signal respectively, and wherein the upper gate driver circuit is coupled between a boot voltage and a node between the upper gate switch and the lower gate switch, and wherein the first upper gate sampling signal is obtained from a current inflow end of the first transistor, a current inflow end of the second transistor, the boot voltage, or a voltage at the node.

4. The control circuit of claim 1, wherein the sampling transistor and the second transistor share one common current inflow end and one common control end, but have different current outflow ends.

5. The control circuit of claim 1, wherein the sampling transistor is a laterally diffused metal oxide semiconductor (LDMOS) device, a junction field effect transistor (JFET), or a bipolar junction transistor (BJT).

6. The control circuit of claim 1, wherein the extractor device includes a resistor.

7. The control circuit of claim 1, wherein the detector device generates the confirmation signal by detecting a level switching point of the second upper gate sampling signal.

8. The control circuit of claim 1, wherein the detector device includes:
   a delay circuit including a resistor and a capacitor electrically connected with each other, the delay circuit receiving the second upper gate sampling signal and generating a delay signal; and
   a comparator, comparing the second upper gate sampling signal and the delay signal to generate the confirmation signal.

9. The control circuit of claim 1, wherein the detector device further includes a bias circuit coupled between the delay circuit and the comparator.

10. A control method for controlling a switching regulator, the switching regulator having an upper gate switch and a lower gate switch for converting an input voltage to an output voltage, the control method comprising:
    receiving a PWM signal and a confirmation signal, and generating a setting signal, a resetting signal, and a lower gate driver circuit;
    converting the setting signal and the resetting signal to upper gate operation signals with predetermined levels, wherein the upper gate operation signals operate between a boot voltage and a voltage at a node between the upper gate switch and the lower gate switch;
    generating an upper gate driving signal according to the upper gate operation signals to control the upper gate switch;
    obtaining a first upper gate sampling signal from the resetting signal, and generating a confirmation signal according to the first upper gate sampling signal, wherein the confirmation signal is for confirming that the upper gate switch has been turned off;
    generating a lower gate control signal according to the confirmation signal; and
    generating a lower gate driving signal according to the lower gate control signal to control the lower gate switch,
    wherein the step of obtaining a first upper gate sampling signal from the resetting signal and generating a confirmation signal according to the first upper gate sampling signal includes:
    providing a sampling transistor which has:
       a current inflow end, from where the first upper gate sampling signal is obtained;

a current outflow end; and a control end, controlled by the resetting signal;

extracting a second upper gate sampling signal from the current outflow end and detecting its level switching point; and generating the confirmation signal according to the level switching point.

11. The control method of claim 10, wherein the first upper gate sampling signal is obtained from one of the upper gate operation signals, the boot voltage, or the voltage at the node between the upper gate switch and the lower gate switch.

12. The control method of claim 10, wherein the step of generating the confirmation signal according to the level switching point includes:

delaying the second upper gate sampling signal to generate a delayed second upper gate sampling signal; and comparing the delayed second upper gate sampling signal and the second upper gate sampling signal to generate the confirmation signal.

13. The control method of claim 10, wherein the first upper gate sampling signal is obtained from one of the upper gate operation signals, the boot voltage, or the voltage at the node between the upper gate switch and the lower gate switch.

* * * * *